United States Patent [19]

DeVilbiss

[11] Patent Number: 4,737,993
[45] Date of Patent: Apr. 12, 1988

[54] CABLE BROADCAST TV RECEIVER WITH AUTOMATIC CHANNEL SEARCH RESPONSIVE TO MODE CHANGE

[75] Inventor: Warren C. DeVilbiss, Noblesville, Ind.

[73] Assignee: RCA Corporation, Princeton, N.J.

[21] Appl. No.: 5,791

[22] Filed: Jan. 21, 1987

[51] Int. Cl.$^4$ .......................... H04B 1/16; H04N 5/44
[52] U.S. Cl. .................................... 455/180; 455/168; 455/186; 358/191.1
[58] Field of Search ................ 455/161, 166, 168, 180, 455/185, 186, 179; 358/191.1, 193.1

[56] References Cited

U.S. PATENT DOCUMENTS

| | | | |
|---|---|---|---|
| 4,317,227 | 2/1982 | Skerlos et al. | 455/168 |
| 4,527,194 | 7/1985 | Sizazi | 455/186 |
| 4,598,425 | 7/1986 | Skerlos et al. | 455/180 |

Primary Examiner—Jin F. Ng
Attorney, Agent, or Firm—Paul J. Rasmussen; Peter M. Emanuel; Richard G. Coalter

[57] ABSTRACT

A "cable-ready" receiver includes a controller for selecting broadcast ("air") and cable channels tuned by a tuner. When switching between air and cable tuning modes the controller stores the number of the channel tuned in the previous mode and retunes the tuner to the stored channel if the number is within a range of valid channel numbers for the new tuning mode. If not, the controller increments the number until it is both in the range and present in a user selected channel tuning list and retunes the turner to the incremented number. In another embodiment the controller increments the number until it is within the valid channel range and a video detector signifies that the channel is occupied. Both examples increase the likelihood that an active channel will be tuned when changing the air/cable tuner operating modes.

2 Claims, 2 Drawing Sheets

CABLE BROADCAST TV RECEIVER WITH AUTOMATIC CHANNEL SEARCH RESPONSIVE TO MODE CHANGE

FIELD OF THE INVENTION

This invention relates to television receivers of the type capable of tuning both broadcast and cable television channels.

BACKGROUND OF THE INVENTION

Television receivers are commercially available which are capable of tuning either standard broadcast channels or cable television channels. The channel frequencies assigned to broadcast signals delivered "over-the-air" can differ from those used by cable service. For this reason so-called "cable ready" television receivers include a receiving mode control switch (or "AIR-CABLE" switch) which is manually settable to condition the receiver tuner to tune either broadcast or cable channels depending on whether the RF input is connected to a broadcast receiving antenna or to a cable TV distribution network. A further feature of certain cable-ready receivers is the inclusion of a channel memory which the user may program to store the channel numbers of particular channels he would like to receive and to delete the numbers of inactive or undesired channels. Receivers having this feature tune only to channels listed in the memory and skip over unlisted channels when in a channel scanning mode of operation (e.g., scan-UP or scan-DOWN) and so provide the user with a very rapid channel search.

A potential problem exists in cable-ready television receivers of the type described when switching between the cable and air operating modes. As an example, assume that the receiver is connected to a cable source and is tuned to cable channel 85. If the user then connects an antenna to the receiver for receiving broadcast signals and changes the cable/air switch to the air (broadcast) mode, the tuner will attempt to tune broadcast channel 85. There is, however, no channel 85 assigned to broadcast television services. In the absence of a "valid" channel 85 in the air mode, the receiver tuning voltage may be forced a maximum value, a situation which might be detrimental to the tuner and tuning system. Additionally, in this condition the user will be presented with visual noise instead of a picture and may experience some momentary confusion as to why the receiver will not operate in the air mode for the particular channel selected.

Heretofore this problem has been addressed by automatically setting the tuner to a specific channel (e.g., Channel 2) when the cable-air mode switch is changed if the previous channel tuned was not a "valid" channel in the new tuning mode. Certain cable-ready television receivers, such as those employing the model CTC-130 color television chassis manufactured by RCA Corporation, have such a feature.

SUMMARY OF THE INVENTION

It is herein recognized that the foregoing solution to the "valid channel" problem of defaulting to a specific television channel can nevertheless result in an unoccupied channel being tuned in locations where the specific channel is not being used.

The present invention is directed to meeting the need for tuning apparatus for a cable ready television receiver having an increased probability that an active television channel will be tuned when switching between cable and air operating modes.

Tuning apparatus in accordance with a first aspect of the invention includes tuner means having an "air" tuning mode for tuning standard broadcast channels and a "cable" tuning mode for tuning cable channels and a switch means for selecting the two tuning modes. A control means, responsive to the switch means, places the tuner means in selected ones of the tuning modes. A user programmable memory means is provided for storing a list of user selected channel numbers. The control means is further responsive to a change in the tuning mode selected by the switch means for causing the tuner means to tune to a previously tuned channel in the changed tuning mode if th previous channel number is within a range of valid channel numbers for the currently selected tuning mode. The control means being responsive otherwise for incrementing the previous channel number until the incremented number is within the range of valid numbers for the mode selected and is also in said list of selected channel numbers for causing said tuner means to tune to a new channel corresponding to the incremented number.

In accordance with another embodiment of the invention the tuning apparatus includes a detector means responsive to the tuner output signal for identifying occupied channels. In this embodiment, the control means is responsive to a change in the tuning mode selected by the mode control switch means for causing the tuner means to tune to a channel tuned in the previous mode conditioned upon the previous channel number being within a range of valid channels for the mode selected. The control means being responsive otherwise for incrementing the previous channel number until the incremented number is both in the range and is identified as being occupied by the detector means for causing the tuner means to tune to the incremented channel number.

DETAILED DESCRIPTION

Figure 1:
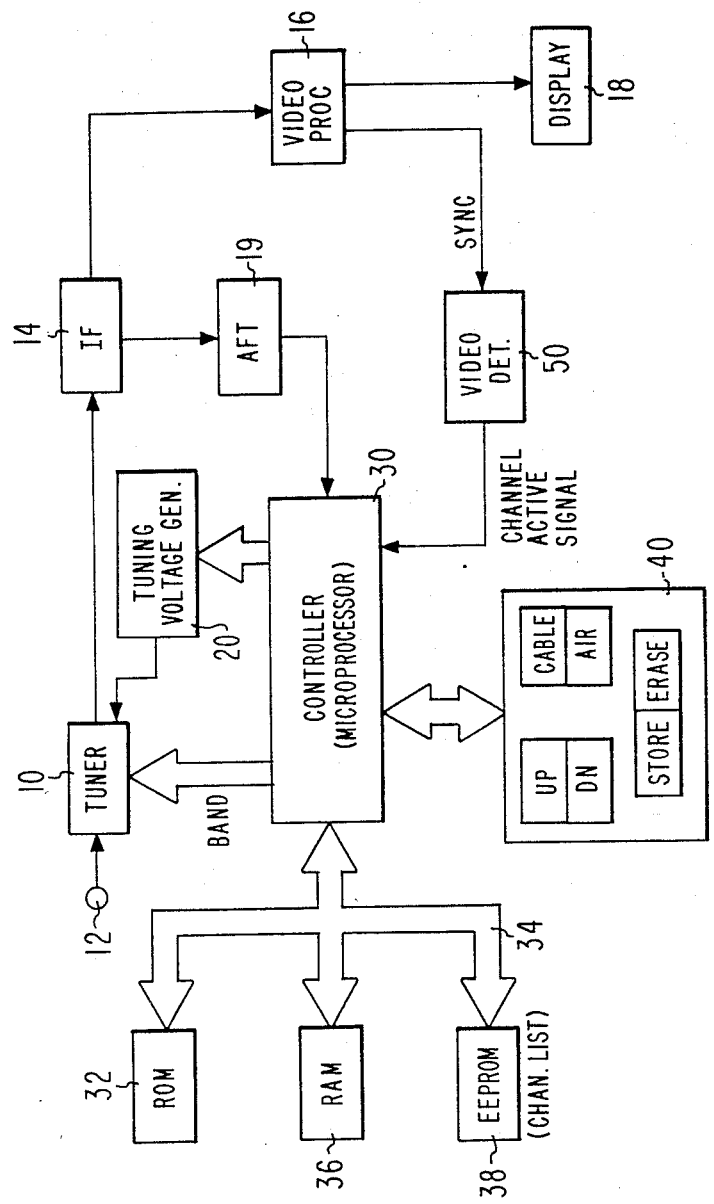
FIG. 1 is a block diagram of a television receiver embodying the invention.

The receiver of FIG. 1 includes a tuner having an antenna input terminal 12 for connection to a broadcast receiving antenna for receiving "off-the-air" RF signals associated with standard broadcast or "air" channels. Alternatively, terminal 12 may be connected to a cable distribution network for receiving RF signals associated with respective cable television channels. Tuner 3 is a dual mode tuner, that is, it is capable of tuning either air channels or cable channels. Such tuners are well known in the art and are sometimes referred to as being "cable-ready" or "cable campatible". Tuner 3 includes an RF stage and a local oscillator responsive to a tuning voltage and band selection signals for converting (heterodyning) the RF signal associated with a selected channel to a corresponding IF signal.

The IF signal is processed in conventional fashion in an IF section 14 and coupled to a video signal processing section 16. Video signal processing section 16 demodulates the modulated picture carrier of the IF signal to produce a baseband video signal for display by a display unit 18 coupled to the processing unit output. Other processing functions provided include luma-chroma separation, sync signal detection ans so forth.

An automatic fine tuning (AFT) signal representing the deviation, if any, of the frequency of the picture carrier of the IF signal from a nominal frequency value, e.g., 45.75 MHz in the United States, is generated by an AFT detector 19 coupled to IF unit 14. The AFT signal is utilized in the tuning process for fine tuning tuner 10. A composite synchronization ("sync") signal is derived from the video signal by video processor 16. In addition to its traditional use, the composite synchronization signal is also utilized in the tuning process, as will be described, for identifying "active" or "occupied" channels tuned by tuner 10. As used herein these terms refer to the channel tuned as actually being used by the broadcast or cable service for conveying video signals.

The tuning voltage for tuner 10 is generated by a tuning voltage generator 20 in response to a digital representation of the tuning voltage. Tuning voltage generator 13 may be of the voltage synthesis type including a digital-to-analog converter or of the frequency synthesis type including a frequency or phase locked loop. In the preferred embodiment, tuning voltage generator 20 is of the frequency synthesis type because of the inherent accuracy and stability of the type of system. A suitable frequency synthesis type of tuning voltage generator including a phase locked loop (PLL) is described in U.S. Pat. No. 4,405,947 issued in the name of J. Tults and M. P. French on Sept. 20, 1983. A suitable frequency synthesis type of tuning voltage generator including a frequency locked loop (FLL) is described in U.S. Pat. No. 4,485,404 issued in the name of J. Tults on Nov. 27, 1984. In the present embodiment is is assumed that a PLL is employed.

Briefly, a PLL tuning voltage generator includes a cascade of a fixed frequency divider for dividing the frequency of the local oscillator signal by a factor K (usually referred to as a "prescaler") and a programmable frequency divider for dividing the frequency of the output signal of the programmable frequency divider by a factor N. A fixed frequency divider divides the frequency ($f_{XTAL}$) output signal of a crystal oscillator by a factor R to derive a reference frequency signal. A phase comparator compares the output signal of the programmable divider to generate an "error" signal representing the phase and frequency deviations between the output signal of the programmable divider and the reference frequency signal. The error signal is filtered to produce the tuning voltage. A microprocessor based controller 30 generates a digital representation of the programmable factor N for controlling the frequency of the local oscillator signal and the band selection signals for tuner 3. Microprocessor 30 operates under the control of a computer program stored in a read-only memory (ROM) 32 coupled thereto via bus 34 which is also coupled to a random access memory (RAM) 36 that provides temporary processing storage and to an electrically erasable programmable read only memory (EE-PROM) that provides the function of nonvolatile storage of a list of user selected channel numbers. Microprocessor 30 responds to user command signals generated by a user control keyboard 40. Although keyboard 40 is shown directly connected to microprocessor 30, it may alternatively comprise the keyboard of a remote control unit.

Keyboard 40 includes keys for controlling various functions of the television receiver such as turning the receiver "on" and "off", controlling the volume level, selecting either the "air" or "cable" tuning modes, selecting channels and storing the user's selected channel list in EEPROM 38. Only the keys germane to the present invention are shown. "Channel up" (UP) and "channel down" (DN) keys are provided for initiating a "channel scanning" mode of channel selection in which channels are successively tuned in increasing or decreasing frequency order until a channel in a list of preselected channels stored in EEPROM 38 is located. Those channels not in the preselected list will be automatically skipped during the channel scanning mode. Programming of the channel list is provided by the "store" and "erase" keys on keyboard 40.

The "cable" and "air" keys select the tuning mode of tuner 10 which changes between air and cable channels because of different channel assignments in the two tuning modes. Also, the channel number assigned to one mode can be "invalid" in the other mode. As an example, recent changes in broadcast channel assignments have eliminated channels 70-83 in the United States. Also, channel 1 is also not assigned to broadcast television. Accordingly, the range of valid "air" channels in the receiver extends from channel 2 to channel 69, inclusive. Channel 1 is a valid channel designation under the modern EIA/NCTA channel identification plan. It corresponds to the former channel designation of "4+". The highest cable designated channel channel number is 99 which corresponds to the channel formerly designated "A−1". In a specific application of the invention the cable channels 90-97 are not used thus giving a valid cable channel range of 1-89, plus 98 and 99. The "valid channel" range information is stored in ROM 32 and utilized in accordance with the invention and will be described.

The receiver/monitor of FIG. 1 includes a video signal detector 50 coupled to receive the sync signal provided by video processor 16 and coupled to supply an "active channel" or "channel occupied" indicator signal to controller 30 when signal tuned by tuner 10 is an active video signal. Detector 50 may be implemented by detecting synchronizing components which comply with a given broadcast standard. For NTSC standard video signals the vertical synchronizing signal should be at either 59.94 Hz or 60 Hz for color or monochrome transmissions, respectively, and the horizontal synchronizing component should be at frequencies of 15,734 Hz or 15750 Hz for color or monochrome. If, in NTSC standard receivers, the vertical synchronizing signal is used for active video signal detection, the range should be at least from 59.94 to 60 Hz. Similarly, for NTSC standard receivers, the detection range for horizontal synchronizing signals should cover the range from 15,734 Hz to 15,750 Hz at least. Both vertical and horizontal synchronizing signals may be used for valid video signal detection if desired. For PAL or SECAM standard receivers the appropriate vertical and/or horizontal synchronizing signal frequencies may be used for valid video signal identification. An alternative to detection of synchronizing signal timing for identification of "valid" video signals (as distinguished from noise) would be to measure the width or amplitudes (tip-to-porch) of the signal to verify that the channel is "occupied" by a video signal and not just noise.

In accordance with an aspect of the invention, the selection of a channel to be tuned by tuner 10 subsequent to a change in the air/cable operating mode is made conditional on two factors selected so as to increase the likelihood of tuning an active channel. In a presently preferred first embodiment of the invention, use is made of the valid channel range list in ROM 32 and the user selected channel list in EEPROM 38 as is illustrated in the program flow chart shown in FIG. 2.

In the following example of operation, it will be assumed initially that the user has been watching a cable television program, and has decided to switch to broadcast reception. To do this, the user disconnects the antenna input 12 from the cable source, reconnects it to a broadcast receiving antenna and then depresses the "air" mode selection key on keyboard 40. In the embodiment exemplified by FIG. 2, the first action taken by controller 30 is to sense that a change has occurred in the cable/air operating mode. This is done by sensing the depression of the "air" mode key, and in response thereto controller 30 stores the currently tuned channel number in RAM 36 ("load channel").

The next step is to compare the stored channel number with the valid range for the "air" operating mode. As previously mentioned, the valid air tuning mode range is from channel 2 to channel 69 (inclusive) for this particular embodiment. If the previous channel is within that range, controller 30 generates appropriate tuning signals for causing tuner 10 to tune to the stored channel number in the "air" tuning mode and the program ends. If, however, the channel number is not a valid number for the "air" tuning mode, controller 30 increments it repeatedly until it is both a valid number and a number in the users selected channel list stored in EEPROM 38. When these conditions are met controller 30 sends tuning signals to tuner 10 for selecting a new channel corresponding to the incremented number. Operation is the same when changing from the "air" to the "cable" tuning modes except that the valid cable channel range is different (e.g., channels 1-89, 98, 99 as previously mentioned).

Figure 2:
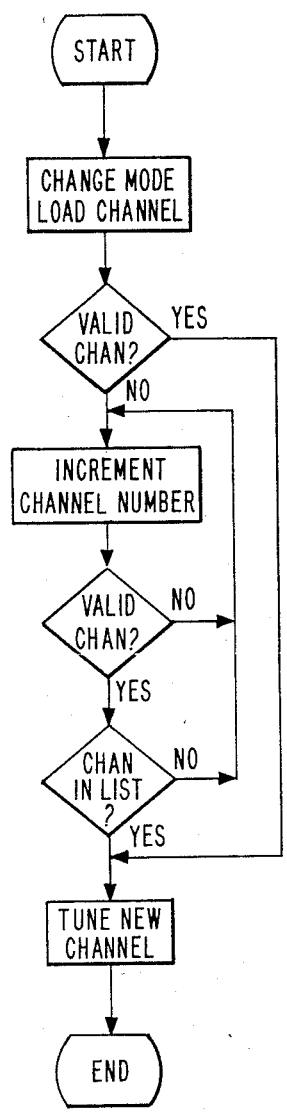
FIGS. 2 and 3 are flow charts illustrating operation of the receiver and embodying aspects of the invention.
Figure 3:
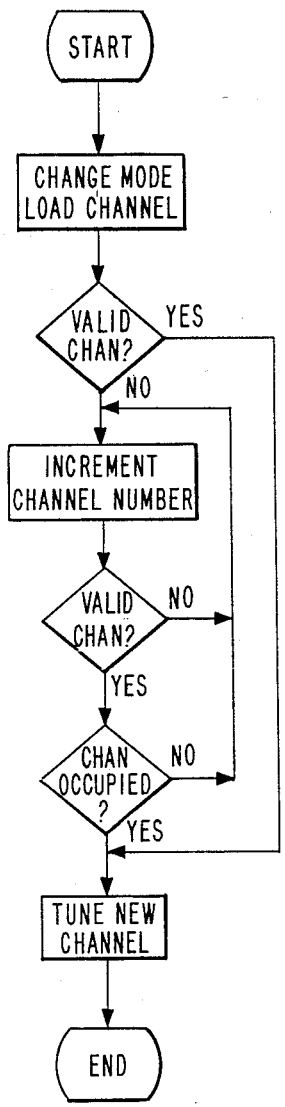

A second embodiment of the invention is illustrated by the flow chart of FIG. 2 which utilizes the output of detector 50. The operations are much the same as in the previous example but with one exception, namely, the channel number incrementing operation. Here, if the previously tuned channel number is not within the valid channel range for the mode selected, it is incremented until is is both within the range and the channel occupied signal of detector 50 signifies that the channel contains an active video signal whereupon the channel scan ends with the receiver tuned to the incremented number. To avoid display flicker during the incrementing operation it may be desirable to blank display 18.

What is claimed is:

1. Tuning apparatus for a television receiver, comprising:
   tuner means having an "air" tuning mode for tuning standard broadcast channels and a "cable" tuning mode for tuning cable channels;
   switch means for selecting said cable and air tuning modes;
   control means responsive to said switch means for placing said tuner means in a selected one of said tuning modes;
   user programmable memory means for storing a list of user selected channel numbers; and wherein:
   said control means being further responsive to a change in said tuning mode selected by said switch means for causing said tuner means to tune to a previously tuned channel in the changed tuning mode if the previous channel number is within a range of valid channel numbers for the currently selected tuning mode;
   said control means being responsive otherwise for incrementing said previous channel number until the incremented number is within said range and is also in said list for causing said tuner means to tune to a channel corresponding to said incremented number.

2. Tuning apparatus for a television receiver, comprising:
   tuner means having an "air" tuning mode for tuning standard broadcast channels and a cable tuning mode for tuning cable channels and providing an output signal;
   switch means for selecting said tuning modes;
   control means responsive to said switch means for placing said tuner in selected ones of said modes;
   detector means responsive to said tuner output signal for identifying occupied channels; and wherein:
   said control means being responsive to a change in said tuning mode selected by said switch means for causing said tuner means to tune to a channel tuned in the previous mode conditioned upon the previous channel number being within a range of valid channel numbers for the tuning mode selected;
   said control means being responsive otherwise for incrementing said previous channel number until the incremented number is both in said range and is identified as being occupied by said detector means for causing said tuner means to tune to a channel corresponding to the incremented number.

* * * * *